United States Patent
Krokhmal et al.

(10) Patent No.: US 10,684,238 B2
(45) Date of Patent: Jun. 16, 2020

(54) METHOD AND APPARATUS FOR X-RAY SCATTEROMETRY

(71) Applicant: BRUKER JV ISRAEL LTD., Migdal HaEmek (IL)

(72) Inventors: Alex Krokhmal, Haifa (IL); Alex Dikopoltsev, Haifa (IL); Juri Vinshtein, Hadera (IL)

(73) Assignee: BRUKER TECHNOLOGIES LTD., Migdal, HaEmek (IL)

( * ) Notice: Subject to any disclaimer, the term of this patent is extended or adjusted under 35 U.S.C. 154(b) by 646 days.

(21) Appl. No.: 15/398,733

(22) Filed: Jan. 5, 2017

(65) Prior Publication Data

US 2017/0199136 A1    Jul. 13, 2017

Related U.S. Application Data

(60) Provisional application No. 62/276,988, filed on Jan. 11, 2016.

(51) Int. Cl.
*G01N 23/00* (2006.01)
*G01N 23/201* (2018.01)
*H01L 21/66* (2006.01)

(52) U.S. Cl.
CPC ....... *G01N 23/201* (2013.01); *G01B 2210/56* (2013.01); *G01N 2223/051* (2013.01); *G01N 2223/6116* (2013.01); *H01L 22/12* (2013.01)

(58) Field of Classification Search
CPC ................. G01N 23/207; G01N 23/20; G01N 23/20008; G01N 23/201
See application file for complete search history.

(56) References Cited

U.S. PATENT DOCUMENTS

| | | | |
|---|---|---|---|
| 4,989,226 A | 1/1991 | Woodbury et al. |
| 5,481,109 A | 1/1996 | Ninomiya et al. |
| 5,619,548 A | 4/1997 | Koppel |
| 5,740,226 A | 4/1998 | Komiya et al. |
| 5,900,645 A | 5/1999 | Yamada |
| 6,041,098 A | 3/2000 | Touryanski et al. |
| 6,163,592 A | 12/2000 | He et al. |
| 6,226,349 B1 | 5/2001 | Schuster et al. |
| 6,242,745 B1 | 6/2001 | Berlad et al. |
| 6,271,534 B1 | 8/2001 | Kumakhov |
| 6,381,303 B1 | 4/2002 | Vu et al. |
| 6,389,102 B2 | 5/2002 | Mazor et al. |
| 6,512,814 B2 | 1/2003 | Yokhin et al. |
| 6,556,652 B1 | 4/2003 | Mazor et al. |

(Continued)

OTHER PUBLICATIONS

INCOATEC GmbH., "Montel Optics—2D Multilayer Mirrors for X-ray Diffractometry", pp. 1-2, year 2015.

(Continued)

*Primary Examiner* — Dani Fox
(74) *Attorney, Agent, or Firm* — Kligler & Associates Patent Attorneys Ltd (57) ABSTRACT

A method for X-ray scatterometry includes receiving a first distribution of an X-ray beam scattered from a sample. The first distribution exhibits asymmetry with respect to a reference axis. A correction is applied to the first distribution, so as to produce a second distribution in which a level of the asymmetry is reduced relative to the first distribution. One or more parameters of the sample are estimated based on the second distribution.

5 Claims, 4 Drawing Sheets

(56) References Cited

U.S. PATENT DOCUMENTS

| | | | |
|---|---|---|---|
| 6,639,968 | B2 | 10/2003 | Yokhin et al. |
| 6,680,996 | B2 | 1/2004 | Yokhin et al. |
| 6,750,952 | B2 | 6/2004 | Grodnensky et al. |
| 6,754,304 | B1 | 6/2004 | Kumakhuv |
| 6,754,305 | B1 | 6/2004 | Rosencwaig et al. |
| 6,782,076 | B2 | 8/2004 | Bowen et al. |
| 6,810,105 | B2 | 10/2004 | Nasser-Ghodsi et al. |
| 6,859,520 | B2 | 2/2005 | He et al. |
| 6,879,051 | B1 | 4/2005 | Singh et al. |
| 6,895,075 | B2 | 5/2005 | Yokhin et al. |
| 7,076,024 | B2 | 7/2006 | Yokhin |
| 7,110,491 | B2 | 9/2006 | Mazor et al. |
| 7,113,566 | B1 | 9/2006 | Peled et al. |
| 7,120,228 | B2 | 10/2006 | Yokhin et al. |
| 7,242,745 | B2 | 7/2007 | He et al. |
| 7,481,579 | B2 | 1/2009 | Yokhin et al. |
| 7,483,513 | B2 | 1/2009 | Mazor et al. |
| 7,551,719 | B2 | 6/2009 | Yokhin et al. |
| 7,600,916 | B2 | 10/2009 | Yokhin et al. |
| 8,243,878 | B2 | 8/2012 | Yokhin et al. |
| 8,437,450 | B2 | 5/2013 | Wall et al. |
| 8,687,766 | B2 | 4/2014 | Wormington et al. |
| 9,335,282 | B2 | 5/2016 | Omote et al. |
| 9,606,073 | B2 | 3/2017 | Mazor et al. |
| 2001/0043668 | A1 | 11/2001 | Hayashi et al. |
| 2003/0128809 | A1 | 7/2003 | Umezawa et al. |
| 2004/0156474 | A1 | 8/2004 | Yokhin et al. |
| 2007/0286344 | A1* | 12/2007 | Yokhin ............... G01N 23/201 378/74 |
| 2014/0019097 | A1 | 1/2014 | Bakeman et al. |
| 2014/0151569 | A1* | 6/2014 | Schnablegger ........ G01N 23/20 250/390.02 |
| 2015/0369759 | A1 | 12/2015 | Mazor et al. |

OTHER PUBLICATIONS

INCOATEC, "The IµS-Story—10 Years Incoatec Microfocus Source", pp. 1-4, year 2016.
Excillum., MetalJet X-Ray Sources, pp. 1-2, year 2018.
Bruker AXS GmbH, "X-Ray source—Microstar", pp. 1-2, Mar. 2018.
Piezomotor., "Linear Motors", pp. 1-5, year 2017.
Lyncean Technologies, Inc, "The Compact X-Ray Station (CXS)", pp. 1-5, year 2017.
Bowen et al., "High resolution x-ray diffractometry and topography", pp. 1-278, Taylor & Francis Publication, year 1998.
Jones et al., "Small angle x-ray scattering for sub-100 nm pattern characterization", Applied Physics Letters, vol. 83, No. 19, pp. 4059-4061, Nov. 10, 2003.
Jones et al., "3-Dimensional Lineshape Metrology Using Small Angle X-ray Scattering", AIP Conference Proceedings, vol. 683, Issue 1, 4 pages, Sep. 2003.
Wormington et al., "Characterization of structures from X-ray scattering data using genetic algorithms", The Royal Society, Philosophical Transactions: Mathematical, Physical and Engineering Sciences, vol. 357, No. 1761, X-Ray Topography and Crystal Characterization, pp. 2827-2848, Oct. 15, 1999.
AXO Dresden GmbH, "Applied X-ray Optics and High Precision Deposition", Technical Data Sheet, 23 pages, May 22, 2013.
Dectris Ltd.,—detecting the future, Eiger X, Detector Series, "The Summit of Hybrid Photon Counting", 4 pages, Sep. 9, 2015.
Oxford Instruments., "50kV Microfocus X-ray source", Technical Data Sheet, 2 pages, May 19, 2015.
Xenocs., "X-ray earn delivery system", Technical Data Sheet, 4 pages, Sep. 15, 2009.
XOS., "Polycapillary Optics for Micro X-Ray Fluorescence and X-Ray Diffraction", 4 pages, Jul. 23, 2015.
Jones et al., "Subnanometer wavelength metrology of lithographically prepraed structures: a comparison of neutron and X-ray scattering", Proceedings of the SPIE, vol. 5038, pp. 191-199, 2003.
Wiener et al., "Characterization of Titanium Nitride Layers by Grazing-Emission X-Ray Fluorescence Spectrometry", Applied Surface Science, vol. 125, pp. 129-136, Elsevier Science B.V., year 1999.
Oxford Instruments Inc., X-ray Tube Information, Series 5000, Model XTF5011, "Packaged X-Ray tubes", Technical Data Sheet, 3 pages, Jun. 1998.
Hayashi et al., "Refracted X-Rays Propagating Near the Surface Under Grazing Incidence Condition", Spectrochimica Acta, Part B 54, pp. 227-230, year 1999.
X-Ray Optical Systems, Inc., "Monolithic Polycapillary Lens Information", Albany, USA, 1 page, Dec. 29, 1998.
Di-Fonzo et al., "Non-Destructive Determination of Local Strain with 100-Nanometre Spatial Resolution", Letters to Nature, vol. 403, pp. 638-640, Feb. 10, 2000.
Guerault, "Specular Reflectivity and Off-Specular Scattering: Tools for Roughness Investigation", Institute Voor Kern-en Stralingsfysica, 15 pages, Dec. 15, 2000.
Hu et al., "Small Angle X-Ray Scattering Metrology for Sidewall Angle and Cross Section of Nanometer Scale Line Gratings", Journal of Applied Physics, vol. 96, No. 4, pp. 1983-1987, Aug. 15, 2004.
Wu et al., "Small Angle Neutron Scattering Measurements of Nanoscale Lithographic Features", Polymer Preprints, vol. 42, No. 1, pp. 265-266, year 2001.
Kojima et al., "Structural Characterization of Thin Films by X-Ray Reflectivity", Rigaku Journal, vol. 16, No. 2, pp. 31-41, year 1999.

* cited by examiner

METHOD AND APPARATUS FOR X-RAY SCATTEROMETRY

CROSS-REFERENCE TO RELATED APPLICATIONS

This application claims the benefit of U.S. Provisional Patent Application 62/276,988, filed Jan. 11, 2016, whose disclosure is incorporated herein by reference.

FIELD OF THE INVENTION

The present invention relates generally to X-ray analysis, and particularly to methods and systems for improving acquisition of X-ray signals.

BACKGROUND OF THE INVENTION

X-ray scatterometry techniques are used for measuring geometrical structures of semiconductor devices. For example, U.S. Patent Application Publication 2015/0369759, whose disclosure is incorporated herein by reference, describes an apparatus including a source-mount that rotates about an axis, and an X-ray source on the source-mount that directs first and second incident beams of X-rays to impinge on a sample at first and second angles along beam axes that are orthogonal to the axis. An X-ray detector on a detector-mount receives first and second diffracted beams of X-rays transmitted through the sample in response to first and second incident beams, and outputs first and second signals, respectively, in response to the received first and second diffracted beams. A processor analyzes the first and the second signals so as to determine a profile of a surface of the sample measured.

SUMMARY OF THE INVENTION

An embodiment of the present invention that is described herein provides a method for X-ray scatterometry, including receiving a first distribution of an X-ray beam scattered from a sample. The first distribution exhibits asymmetry with respect to a reference axis. A correction is applied to the first distribution, so as to produce a second distribution in which a level of the asymmetry is reduced relative to the first distribution. One or more parameters of the sample are estimated based on the second distribution.

In some embodiments, the reference axis is normal to the sample. In an embodiment, applying the correction includes averaging intensities of the first distribution that are located at a corresponding angular distance on opposite sides of the reference axis. In another embodiment, receiving the first distribution includes receiving at least first and second versions of the first distribution, acquired by positioning the sample at respective first and second orientations relative to an incident X-ray beam, and applying the correction includes choosing a version of the first distribution, having a lowest level of the asymmetry, to serve as the second distribution.

In yet other embodiments, applying the correction includes applying to the first distribution an asymmetric correcting function with respect to the reference axis. In an example embodiment, the asymmetry in the first distribution is caused by background signals, and the correcting function is based on an empirical correction applied to compensate for the background signals. In another embodiment, the correcting function is based on a calculated model.

In some embodiments, estimating the parameters includes measuring a dimension of a feature on the sample. Additionally or alternatively, estimating the parameters includes measuring a distance between features on the sample. In an embodiment, the first distribution is acquired while a beam-stopper that is partially-opaque to the X-ray beam is placed in the X-ray beam, and the method further includes correcting an angular position or an intensity of the X-ray beam based on the first distribution.

There is additionally provided, in accordance with an embodiment of the present invention, an apparatus for X-ray scatterometry, including an interface and a processor. The interface is configured to receive a first distribution of an X-ray beam scattered from a sample. The first distribution exhibits asymmetry with respect to a reference axis. The processor is configured to apply a correction to the first distribution, so as to produce a second distribution in which a level of the asymmetry is reduced relative to the first distribution, and to estimate one or more parameters of the sample based on the second distribution.

There is also provided, in accordance with an embodiment of the present invention, a computer software product, the product including a tangible non-transitory computer-readable medium in which program instructions are stored, which instructions, when read by a processor, causes the processor to receive a first distribution of an X-ray beam scattered from a sample, wherein the first distribution exhibits asymmetry with respect to a reference axis, to apply a correction to the first distribution so as to produce a second distribution in which a level of the asymmetry is reduced relative to the first distribution, and to estimate one or more parameters of the sample based on the second distribution.

There is further provided, in accordance with an embodiment of the present invention, a system including an X-ray source, a detector assembly and an X-ray beam stopper. The X-ray source is configured to direct an X-ray beam on a sample. The detector assembly is configured to detect one or more X-ray beams transmitted through and scattered from the sample, and to produce respective electrical signals in response to the detected X-ray beams. The X-ray beam stopper is only partially-opaque to X-rays, is located between the sample and the detector assembly, and is configured to partially-block and partially-transmit an intensity of one or more of the X-ray beams impinging thereon.

There is moreover provided, in accordance with an embodiment of the present invention, a system including an X-ray source, a detector assembly and an X-ray beam stopper. The X-ray source is configured to direct an X-ray beam on a sample. The detector assembly is configured to detect one or more X-ray beams transmitted through and scattered from the sample over an angular range, and to produce respective electrical signals in response to the detected X-ray beams. The X-ray beam stopper is located between the sample and the detector assembly and has a configurable effective width, and is configured to at least partially block an intensity of the X-ray beams within a configurable partial sector of the angular range, depending on the configurable effective width.

In an embodiment, the X-ray beam stopper includes first and second beam-stopping elements, which are movable relative to one another so as to set the effective width. In another embodiment, the X-ray beam stopper includes a rotatable beam stopping element, which is configured to rotate about an axis so as to set the effective width. In yet another embodiment, the X-ray beam stopper includes two or more beam stopping elements having different effective widths, and the system further includes a stage, which has the beam stopping elements mounted thereon and is configured to set the effective width by positioning a selected beam stopping element between the sample and the detector assembly.

The present invention will be more fully understood from the following detailed description of the embodiments thereof, taken together with the drawings in which:

DETAILED DESCRIPTION OF EMBODIMENTS

Overview

Scatterometry techniques may be used to measure geometrical dimensions of the features in an array formed in various types of semiconductor devices and test structures. X-ray techniques, such as small-angle X-ray scattering (SAXS) methods, typically apply X-rays whose wavelengths are on the order of a few angstroms, are suitable for measuring High Aspect Ratio (HAR) features such as HAR holes or trenches fabricated in semiconductor wafers. Measuring the geometrical properties of features is carried out using estimation techniques that are based on analyzing the intensity of the X-rays scattered from the sample at multiple angles.

In the description that follows, for the sake of clarity, the terms "measure", "determine" and "estimate" are used interchangeably. Furthermore, the terms "trench" and "line" are used interchangeably.

In some situations, however, the scattered X-rays may contain undesired reflections of X-ray photons from the sidewalls of deep holes, which may interfere with the measurement and degrade the measurement quality. The extent or intensity of the undesired reflected beams typically increases with the aspect ratio of the features, and therefore HAR holes are hard to measure. In practice, undesired reflections often appear as an asymmetric distribution of the detected intensity of SAXS photons, with respect to an axis normal to the sample or other reference axis.

Embodiments of the present invention that are described hereinbelow provide improved methods and systems for X-ray scatterometry in the presence of undesirable X-ray reflections that cause asymmetry in the measured intensity distribution. The disclosed techniques apply a correction to the measured X-ray distribution, so as to produce a corrected distribution in which the level of asymmetry is reduced. Subsequent processing, e.g., measurement or determination of dimensions of geometrical features from the distribution, is performed on the corrected distribution. In particular, the disclosed technique enables accurate measurement of HAR holes in a wafer by reducing the asymmetry caused by undesired X-ray reflections, e.g., from sidewalls of the holes.

In various embodiments, asymmetry reduction may be performed in various ways. In some embodiments, the sample is measured at two or more orientations relative to the incident X-ray beam. For example, the sample may be positioned so that in two separate measurements the front side and back side of the sample is facing the incident beam, respectively. The measurement in each orientation produces a respective intensity distribution of the X-ray beams scattered from the sample with a respective level of asymmetry. Accurate measurement is achieved by selecting the measurement for which the distribution exhibits the lowest level of asymmetry.

In other embodiments, the level of asymmetry is reduced by averaging corresponding intensity values on either side of the reference axis. In yet other embodiments, the level of asymmetry is reduced by applying to the intensity distribution an empirical or model-based background function, which is asymmetric with respect to the reference axis, so as to compensate for the expected asymmetry in the measured intensity distribution.

System Description

Figure 1:
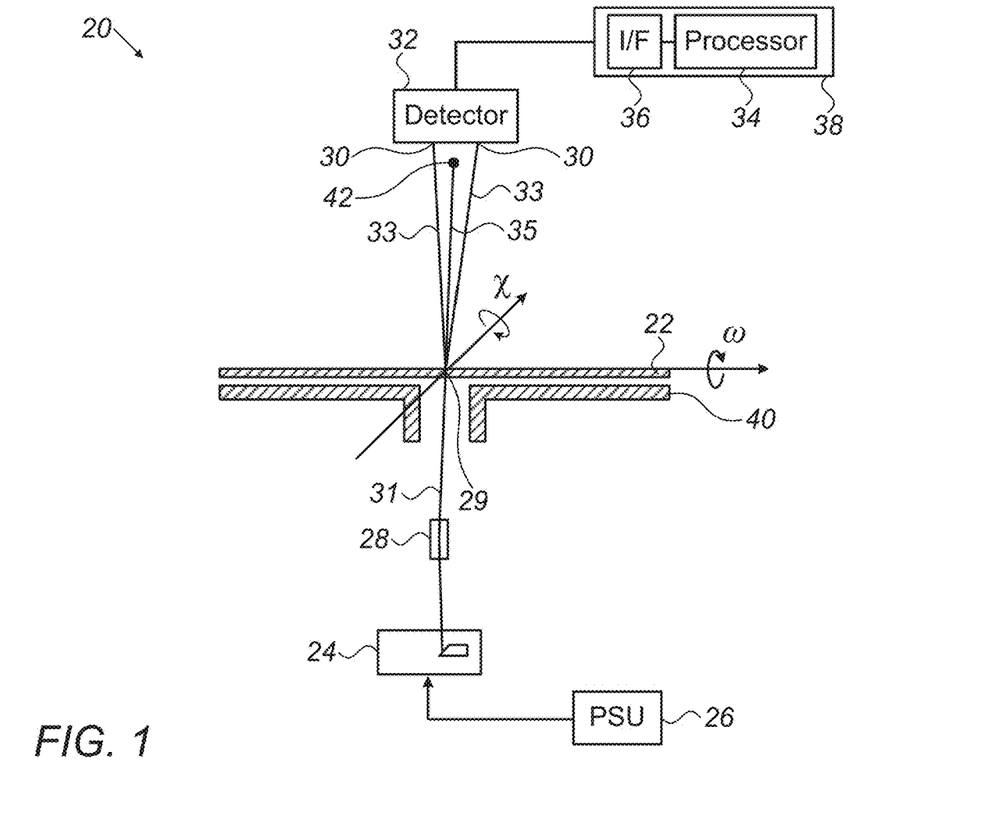
FIG. 1 is a schematic illustration of a small-angle X-ray scattering (SAXS) system, in accordance with an embodiment of the present invention.

FIG. 1 is a schematic illustration of a small-angle X-ray scattering (SAXS) system 20, in accordance with an embodiment of the present invention. In some embodiments, system 20 is configured to measure features on a sample using scatterometry techniques, as will be described hereinbelow.

Figure 2:
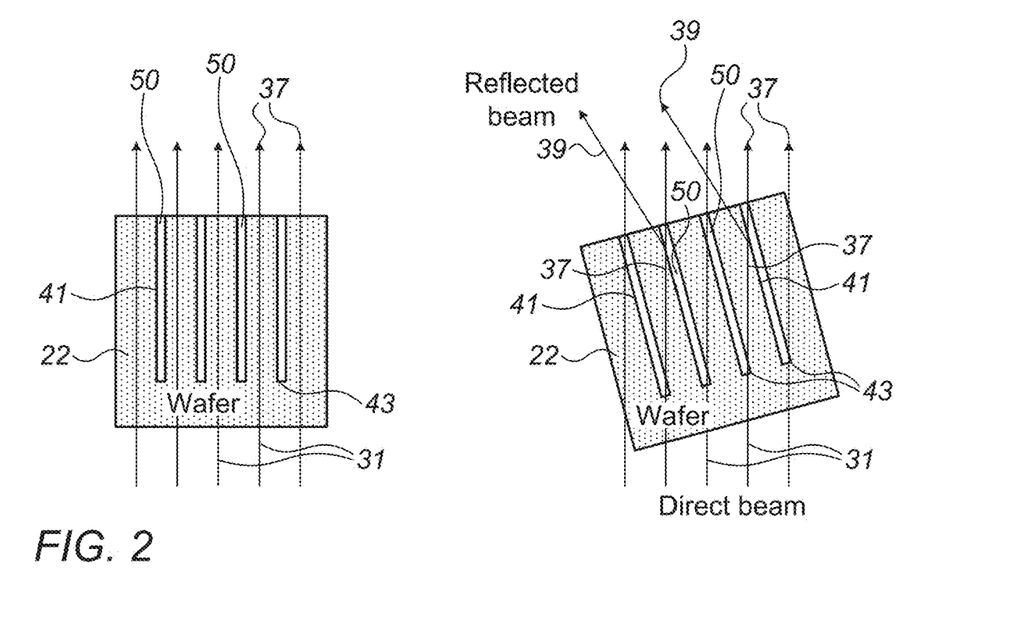
FIG. 2 is a schematic, sectional view of a wafer in which High Aspect Ratio (HAR) holes are formed, and X-rays scattered from the wafer and holes, in accordance with an embodiment of the present invention.
Figure 4:
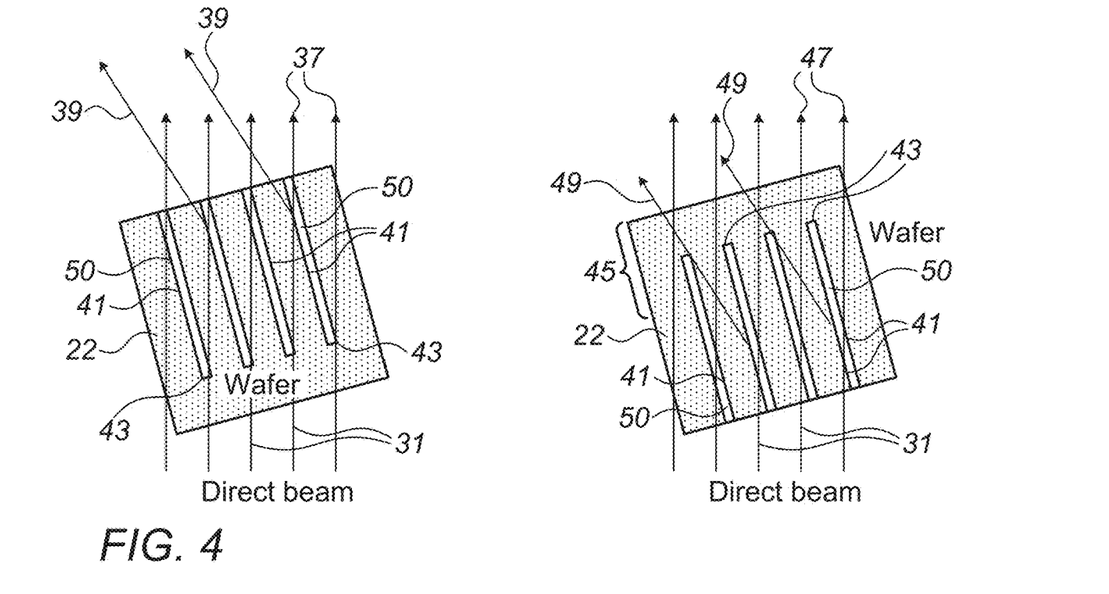
FIG. 4 is a schematic, sectional view of a wafer in which HAR holes are formed, and X-rays scattered from the wafer and holes, in accordance with another embodiment of the present invention.

In some embodiments, the sample may comprise a semiconductor wafer 22 having arrays of high aspect ratio (HAR) features etched into wafer 22 or disposed thereon. Sectional views of wafer 22 and the HAR features are depicted in FIGS. 2 and 4 below. Generally, however, system 20 can be used for measuring any other suitable feature.

In some embodiments, system 20 comprises an excitation source, such as an X-ray source 24, driven by a high-voltage power supply unit (PSU) 26. In some embodiments, source 24 emits an X-ray beam having a suitable energy to penetrate wafer 22, e.g. characteristic Kα radiation from molybdenum (17 keV), silver or indium, flux and angular divergence. The X-ray beam passes X-ray optics 28, which may include apertures, such as slits, diffractive elements such as crystals or multilayer mirrors to adapt the X-ray beam onto a small region 29 of the wafer, typically a spot on the order of <100 μm in diameter, and collimated, typically to an angular resolution <1 milliradians (mrad), in at least one direction.

In an embodiment, wafer 22 is mounted on a movable platform, such as an X-Y-χ-ω stage 40, which enables moving wafer 22 relative to the X-ray beam in the X and Y directions, as well as applying azimuthal rotation χ about an axis perpendicular to the surface of wafer 22, and tilt rotation ω about an axis parallel to the surface of the wafer.

In an embodiment, stage 40 is designed as an open frame (i.e., having no material in the center) so as to allow an incident beam 31 to directly impinge on a lower surface of wafer 22 at region 29. The beam passes through the wafer and is scattered from an array of High Aspect Ratio (HAR) features formed in the upper surface of wafer 22.

In some embodiments, incident beam 31 may impinge on region 29 normal to the lower surface of wafer 22, or at any other suitable angle. Some of incident beam 31 is absorbed as it traverses the sample and a transmitted beam 35 exits the upper surface of the wafer 22 in the same direction of the incident beam. Additional beams 33, scattered from the arrays of features exit at different directions to transmitted beam 35 with respect to the upper surface of wafer 22.

Figure 6:
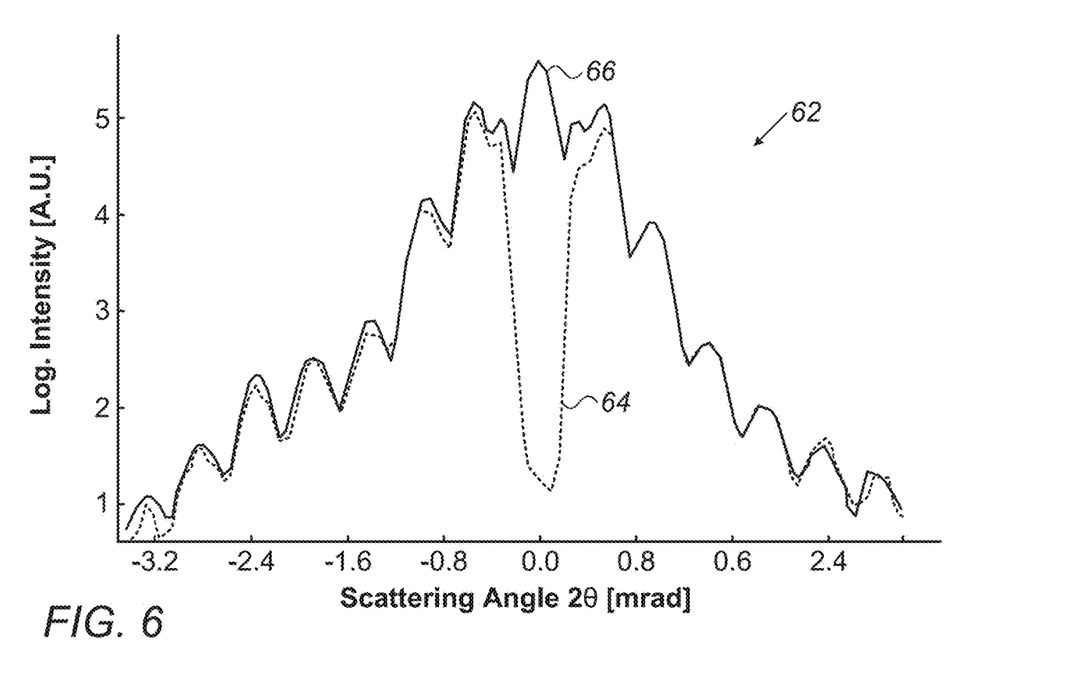
FIG. 6 is a graph of an intensity distribution of X-ray photons, as a function of scattering angles of reflected X-ray beams and opaqueness of a beam-stopper, in accordance with an embodiment of the present invention.
Figure 7:
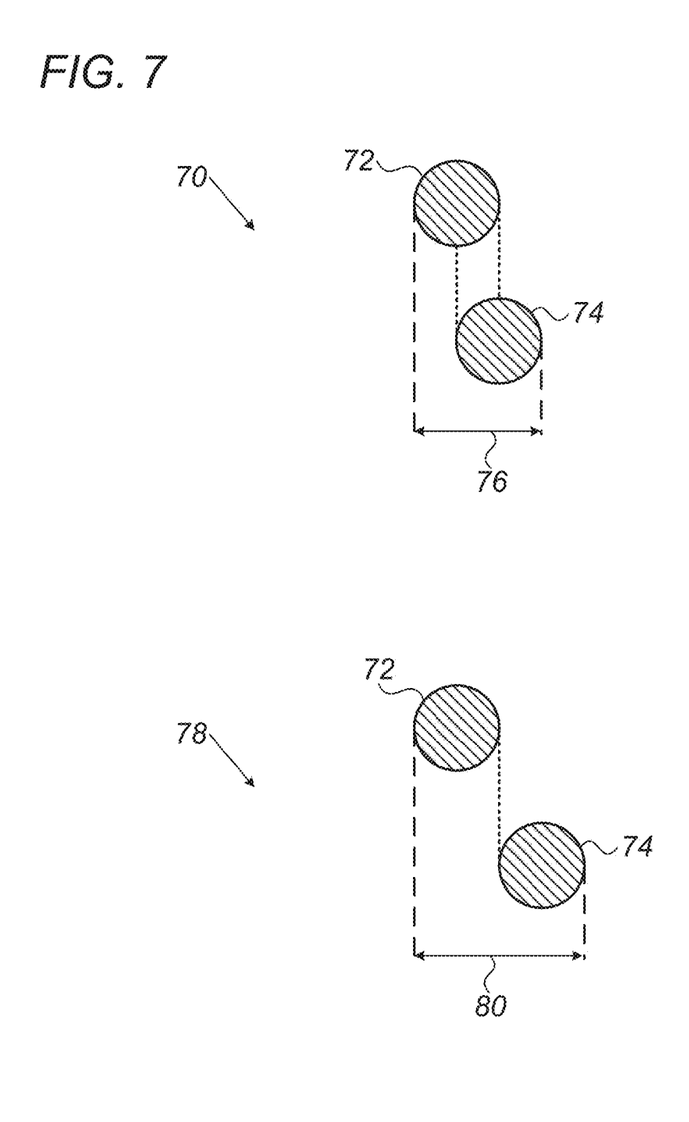
FIG. 7 is a schematic illustration of sectional view of two settings of an adjustable effective width of a beam stopper, in accordance with an embodiment of the present invention.

In some embodiments, a detector assembly 32 is configured to detect X-ray photons of beams 33 impinging on detector assembly 32 at one or more regions 30. In an embodiment, a beam-stopper 42 made from an X-ray opaque or partially-opaque material, is located between wafer 22 and assembly 32, and is configured to occlude at least part of beam 35 from irradiating detector assembly 32. The opaqueness level of beam-stopper 42 affects the signals produced by assembly 32, as depicted in FIG. 6 below. One example implementation of beam-stopper 42 is depicted in FIG. 7 below.

In some embodiments, assembly 32 may comprise a single detector, or an array of detectors arranged around regions 30. The beam detectors may have a two-dimensional (2D) configuration or a one-dimensional (1D) configuration, and are capable of counting X-ray photons. Assembly 32 may be flat, or may have any suitable shape such as an arc angled toward beams 33 and 35. Responsively to the captured photons, assembly 32 generates electrical signals, which are conveyed to a signal processing unit 38.

In some embodiments, unit 38 comprises a processor 34, which is configured to process the electrical signals received from assembly 32, and an interface 36 for communicating the electrical signals between assembly 32 and processor 34.

In some embodiments, processor 34 is configured to acquire data from assembly 32 so as to determine a scattered intensity distribution of the X-ray photons captured by the detector(s) of assembly 32. In an embodiment, processor 34 is configured to use the intensity distribution measured at one or more incident beam angles to estimate (determine) the dimensions of geometrical features on wafer 22 as depicted in FIGS. 2 and 4 below. In this embodiment, processor 34 is configured to calculate intensity distribution from a structural model of the features whose geometric parameters, such as height and width(s) are automatically refined, so as to minimize a numerical difference between the measured and calculated intensity distributions. While the features in FIGS. 2 and 4 depict simple shapes it can be appreciated that more complex shapes may be described by suitable geometric models. Additional parameters describing the arrangement of the features within the array, such as the distance between adjacent features (pitch) can also be determined using an appropriate structural model.

Processor 34 typically comprises a general-purpose computer, which is programmed in software to carry out the functions described herein. The software may be downloaded to the computer in electronic form, over a network, for example, or it may, alternatively or additionally, be provided and/or stored on non-transitory tangible media, such as magnetic, optical, or electronic memory. In an embodiment, the software is configured to perform multiple tasks, such as controlling detector assembly 32, as well as data acquisition and data analysis.

As shown in FIG. 1, stage 40 of system 20 can be moved so as to examine region 29 on wafer 22. In alternative embodiments, wafer 22 is mounted on a suitable stationary fixture (instead of stage 40) while source 24, optics 28 and assembly 32 are moved, so that the X-ray beam scans region 29 or another desired location on wafer 22.

In other embodiments, system 20 may be further configured to capture and process X-rays scattered from wafer 22 by other mechanisms, such as reflection, and/or diffraction. Multi-function systems of this sort are described, for example, in U.S. Pat. Nos. 6,381,303 and 6,895,075, which are incorporated herein by reference.

The example of FIG. 1 refers to a specific configuration of an X-ray system. This configuration, however, is chosen purely for the sake of conceptual clarity. For example, system 20 may further comprise additional modules, such as an optical microscope (not shown) for assisting in the navigation of stage 40 to region 29. In alternative embodiments, the disclosed techniques can be used, mutatis mutandis, in various other types of X-ray systems or analyzing modules known in the art, comprising any suitable excitation source, power source, focusing optics and detection system, may be used for implementing the methods described herein.

Acquisition of Photons Scattered from High Aspect Ratio (HAR) Features

FIG. 2 is a schematic, sectional view of small-angle X-ray beams scattered from HAR features in wafer 22, in accordance with an embodiment of the present invention. FIG. 2 depicts two sectional views of wafer 22, wherein in both views beam 31 impinges the bottom surface of wafer 22 at a different angle.

In some embodiments, wafer 22 comprises arrays of repetitive two-dimensional (2D) HAR features, such as lines or trenches, or three-dimensional (3D) HAR features, such as cylindrical or barrel-shaped holes or pillars. In the present context, the term "aspect ratio" refers to the ratio between the depth and width (e.g., diameter in the case of a circular hole) of the feature in question, e.g., holes 50. Furthermore, the term "high aspect ratio (HAR)" typically refers to an aspect ratio higher than 10.

The sectional views depicted in FIG. 2 are simplified for the sake of clarity. In practice, holes 50 penetrate a considerably smaller portion of the overall thickness of wafer 22 than shown in the figure. Also, in practice wafer 22 typically comprises large arrays of up to millions of repetitive 2D and/or 3D features per array, such as holes 50. The SAXS is applied on multiple holes 50 of the array as will be described in detail below.

Holes 50 may be used for producing semiconductor devices, such as a vertical NAND flash memory, or 3D gates such as finFET gates, using any suitable production technology known in the art. In the example of a vertical NAND memory, each hole 50 has a typical diameter below 100 nm and a typical depth on the order of several μm. In finFET gates a HAR line having a width range of about 10-50 nm may be used instead of hole 50. Furthermore, the disclosed techniques may be used for measuring any HAR feature of any device having suitable dimensions, not limited to semiconductors.

In the example of FIG. 2, the front (upper) surface of wafer 22 is facing detector assembly 32 in both sectional views. The front surface of the wafer is defined as the wafer side containing the features being measured, e.g., holes 50.

Reference is now made to the left sectional view of FIG. 2. Incident beam 31 impinges on the back surface of wafer 22 at a substantially orthogonal angle. Scattered X-ray beams 37 comprise small-angle scattered photons, as well as non-scattered photons, such as beams 33 and 35 shown in FIG. 1 above. In an embodiment, beams 37 impinge on detector assembly 32 that generates an electrical SAXS signal to be processed by processor 34. In some embodiments, the processor processes the SAXS signal for estimating one or more geometrical attributes of hole 50, such as a diameter of surface 43 at the bottom of hole 50, also referred to herein as bottom critical dimension (CD), an angle or profile of sidewalls 41 relative to surface 43, a distance between neighboring holes 50, and/or any other suitable dimension necessary to describe the shape of the features.

Reference is now made to the right sectional view of FIG. 2. In this case, incident beam 31 impinges on the back surface of wafer 22 at an oblique angle. As a result, some of beams 37 impinge on sidewalls 41 of holes 50 and reflect from the sidewalls as beams 39. In this example, assembly 32 detects photons belonging to both beams 37 and beams 39 and generates a corresponding electrical signal to processor 34.

The signal received by processor 34 comprises a desired signal corresponding to the array of scattering features and an incoherent undesired background signal caused by, for example, specular reflections from sidewalls 41 of holes 50. When beam 31 is incident on the sidewalls of holes 50 at an angle similar to the critical angle for total external reflection of the X-ray wavelength being used, e.g., of an order of $\frac{1}{10}$th of a degree, these undesired specular reflections can be comparable in intensity to the desired SAXS. It is thus important to consider the contribution of the undesired signals so as to obtain measurements with high accuracy and precision.

Figure 3:
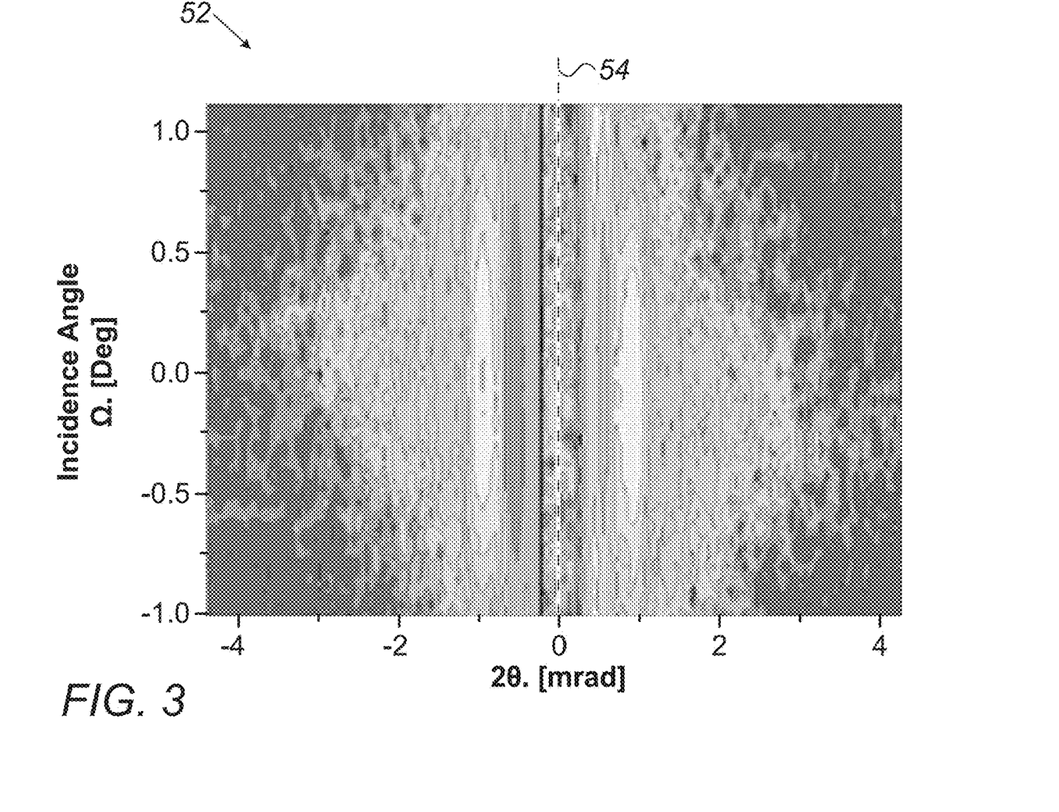
FIG. 3 is a two-dimensional (2D) graph, that schematically depicts intensity distributions of X-ray photons scattered from a wafer, as a function of the incidence angle of an X-ray beam, in accordance with an embodiment of the present invention.

FIG. 3 is a two-dimensional (2D) contour graph 52, which schematically depicts an intensity distribution of X-ray photons scattered from wafer 22, as a function of the incidence angle of beam 31, in accordance with an embodiment of the present invention. In the present example, graph 52 shows the intensity of the X-ray photons of beams 37 and 39 as detected by assembly 32, at various incidence angles of beam 31. Different grey levels in graph refer to different intensity levels of the X-ray photons, with brighter levels corresponding to higher intensity and vice versa.

The vertical axis of graph 52 corresponds to the incidence angle $\Omega$ of beam 31, which is measured in degrees relative to the normal to the plane of wafer 22, and ranges between $-1°$ and $1°$. For a given incidence angle $\Omega$, the horizontal axis of the graph shows the intensity of the X-ray photons as a function of scattering angle $2\theta$. The scattering angle is measured in milliradians (mrad) relative to the surface of assembly 32.

In the example of FIG. 2, a sum of the measured X-ray intensities of scattered beams 37 and reflected beam 39 from a periodic array of holes 50 in a silicon wafer (on which scatterometry techniques are typically applied), is plotted as a contour on graph 52 in grey levels, using arbitrary units (AU) of a logarithmic intensity scale.

Graph 52 comprises a symmetry axis 54 separating between the left and right sides of the graph. Axis 54 is also referred to herein as a reference axis. As can be seen in the figure, a distinct asymmetry exists between the left and right contour plots of the intensity distribution. The inventors found that the asymmetry is caused by the contribution of the specular reflection of reflected beams 39 from sidewalls 41 of holes 50.

Improving Symmetry of Intensity Distribution Caused by Specular Reflections from HAR Features FIG. 4 is a schematic, sectional view of X-ray beams scattered from holes 50 of wafer 22, in accordance with an embodiment of the present invention. FIG. 4 comprises two sectional views of wafer 22, both views show substantially similar incidence angle of beam 31 relative to the surface of wafer 22.

In this embodiment, system 20 measures the X-ray intensity twice, once using the configuration shown on the right-hand side of FIG. 4, and once using the configuration shown on the left-hand side of the figure.

In the left-hand-side sectional view, wafer 22 is positioned similarly to the right-hand-side configuration of FIG. 2 above. As shown above, this geometry is characterized by strong specular reflections from the sidewalls of holes 50, and therefore by considerable asymmetry in the SAXS intensity distribution.

In the right-hand-side sectional view, on the other hand, wafer 22 is flipped upside down so that the top surface faces source 24 and the bottom surface faces detector assembly 32. In this arrangement, a first portion of incident beams 31 impinge on sidewalls 41 so that a beam 49 is reflected therefrom and passes through a bulk 45 of wafer 22 before being emitted from the surface of assembly 32. A second portion of incident beams 31 impinge directly of surface 43 (without interacting with sidewalls 41), and scattered as beams 47, from the backside of wafer 22 to impinge on the surface of assembly 32.

In some embodiments, by flipping wafer 22 upside down, beams 49 have to pass through bulk 45, which attenuates the intensity of beams 49, thereby, improving the symmetry of the contour plot by reducing the contribution of beam 49 to the overall intensity detected by assembly 32.

Thus, in the present embodiment processor 34 receives two X-ray intensity distributions, one acquired using the configuration shown on the left-hand side of FIG. 4, and one acquired with the wafer flipped as shown on the left-hand side of the figure. Processor 34 chooses the intensity distribution having the lowest level of asymmetry as the corrected distribution. In other embodiments, an operator (not shown) may manually select a suitable configuration from the configurations presented at FIG. 4, and apply the selected configuration in subsequent measurements of one or more similar substrates. In yet other embodiments, the operator may apply only the configuration chosen by processor 34 in subsequent measurements of similar substrates.

In alternative embodiments, the two distributions are not necessarily obtained by flipping the wafer (e.g., at 180 degrees), but rather by another suitable angle. In other words, the lowest asymmetry may be obtained by positioning wafer 22 so that its backside surface is facing beam 31 at a selected angle. In an embodiment, the position and orientation of wafer 22 with respect to beam 31 may be application dependent. Examples of applications are listed hereinbelow, but such and other examples are not limited to, the type of HAR feature (hole or trench), the width/diameter and the depth of the HAR feature, whether the HAR feature is tilted with respect to the surface of the wafer, the type of wafer (e.g., silicon, germanium, compound semiconductor), the materials deposited on the wafer, the density of the array of the HAR features, and the intensity of beam 31. Moreover, in some embodiments, processor 34 may choose the intensity distribution having the lowest level of asymmetry, from among more than two candidate distributions acquired at different angles.

Figure 5:
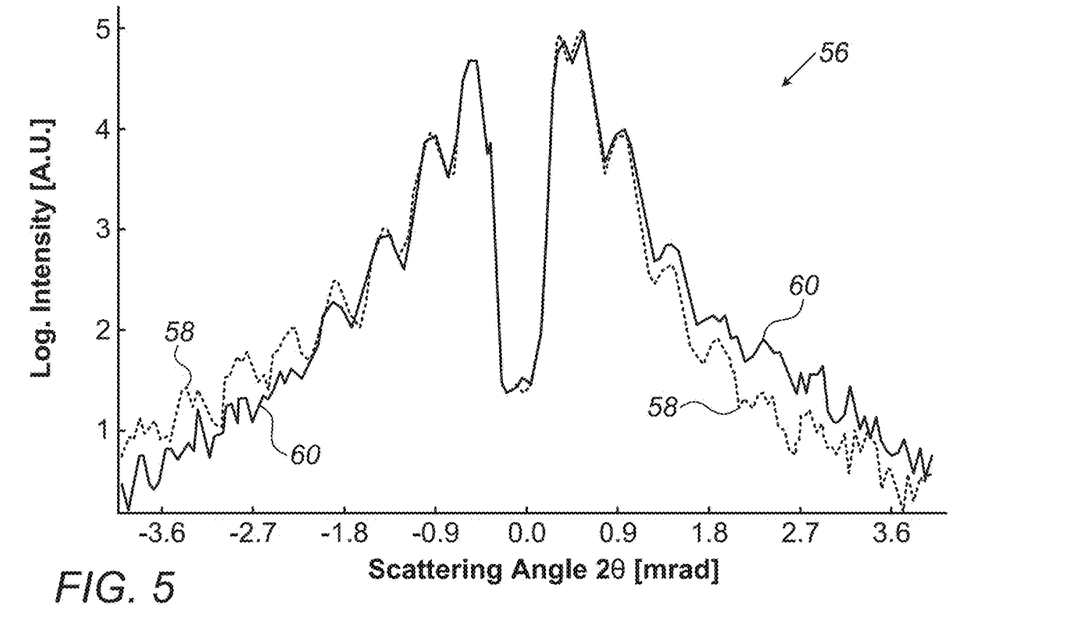
FIG. 5 is a graph of an intensity distribution of X-ray photons, as a function of scattering angles (2Θ) of reflected X-ray beams, in accordance with an embodiment of the present invention.

FIG. 5 is a graph 56 showing intensity distributions of X-ray photons as a function of scattering angle. A curve shows the intensity distribution acquired using the configuration shown on the left-hand side of FIG. 4, with the bottom surface of wafer 22 faces the incident beam. A curve 60 shows the intensity distribution acquired using the configuration shown on the right-hand side of FIG. 4, with wafer 22 flipped upside-down such that the top surface of the wafer faces the incident beam.

As can be seen in the figure, curve 58 has a higher extent of asymmetry relative to the axis of reference (2θ=0) than curve 60. Thus, in the present example, processor 34 would choose curve 60 as the corrected intensity distribution.

In an embodiment, applying an optimal incidence angle (e.g., −0.35 degree) of beam 31 relative to the bottom surface of wafer 22 (e.g., in the right sectional view of FIG. 4) may obtain improved symmetry in trace 58.

In an embodiment, the symmetry level is estimated by measuring the intensity at equal angular distances (e.g., in mrad) from the selected incidence angle, for example, from the 2θ=0 or from an improved incidence angle of −0.35 mrad in the present example.

In alternative embodiments, processor 34 reduces the level of asymmetry in the acquired intensity distribution by averaging the measured intensities obtained at equal angular distances to the left and right sides of the reference axis. For example, before correcting the asymmetry, at an angular distance of 2 mrad from the selected angle, the measured intensity at the left side of trace 60 (e.g., −2.35 mrad), is about 1.8 arbitrary units (AU), whereas at the right side (e.g., +1.65 mrad) the measured intensity is about 2.0 AU. By averaging the measured intensity to about 1.9 at both sides, the asymmetry of trace 60 (for example) may be significantly reduced.

In other embodiments, processor 34 applies the above averaging technique for reducing the asymmetry of 2D intensity distribution plots (e.g., FIG. 3 above). In such embodiments, processor 34 may average intensity values located at corresponding angular distances 2θ to the left and right of axis 54, for the same incidence angle Ω.

In some embodiments, the asymmetry may be further reduced by using an empirical model or by applying a model-based background function, which is asymmetric with respect to the angle of beam 31 on assembly 32, and accounts for the specular contribution of beams 39 and 49 to the measured intensity.

In some embodiments, Equation (1) below provides an expression for the empirical model:

$$B(2\Theta) = B_0 + \begin{cases} B_1^L(2|\Theta| - B_2^L)^{-B_3^L}, & 2\Theta < 0 \\ B_1^R(2\Theta - B_2^R)^{-B_3^R}, & 2\Theta > 0 \end{cases} \quad (1)$$

where $B(2\Theta)$ is the background at the scattering angle $2\Theta$;
$B_0$ is a constant background level common for the entire spectrum;
$B_1^L$, $B_2^L$, $B_3^L$, and $B_1^R$, $B_2^R$, $B_3^R$ are coefficients that describe the shape of the background for the left (L) and right (R) wings of the spectrum, respectively.

Calibration Using Partially-Opaque Beam-Stopper

In some embodiments, processor 34 uses the measured intensity distributions to estimate and track the intensity and/or angular position of the center of the X-ray beam, in order to identify and compensate for instrumental drifts. Such drifts may develop, for example, due to undesired thermal expansion or aging of X-ray source 24.

Tight control over the angular position of the center of the X-ray beam is generally desirable and enables, for example, optimization of the detection of the scattered beams (e.g., beams 47 and 49 of FIG. 4), so as to reduce the asymmetry in the scattered intensity distributions as described above.

In some embodiments, beam stopper 42 (see FIG. 1) is positioned so as to attenuate the X-ray radiation at the center of the beam. This attenuation is necessary, for example, to prevent damage to detector 32 and/or to prevent the detector from saturating and operating in a non-linear region. On the other hand, too large an attenuation would prevent processor 34 for tracking the angular position and intensity of the center of the beam.

Thus, in some embodiments, beam-stopper 42 is made from an X-ray partially-opaque material. The attenuation of beam-stopper 42 is selected to enable reliable measurement of the angular position and intensity of beam 35, and at the same time prevent damage and non-linear distortion in detector assembly 32.

The attenuation factor of beam-stopper 42 is typically selected so that the intensity of beam 35 is attenuated to a few hundreds or thousands of photons per second at detector assembly 32. For a given X-ray energy E, the attenuation of beam-stopper 42 is determined by the relation $\text{Exp}[-\mu(E)*t]$, wherein $\mu(E)$ is the linear attenuation coefficient of X-rays in the material of beam stopper 42 and 't' denotes the thickness of beam stopper 42 in the direction of beam 35. In some embodiments, beam-stopper 42 is made from one or more of the following materials: silicon, germanium, indium-phosphide, tantalum and tungsten. Alternatively, any other suitable material can be used. In an embodiment, these materials may be formed in a single crystal or amorphous material so as to decrease parasitic scattering. In another embodiment, material of low atomic weight may be used to decrease the influence of fluorescence. For example, a beam stopper comprising a 3 mm thickness of single crystal silicon, typically blocks about 99% of 17.5 keV direct radiation of beam 35.

In some embodiments, beam stopper 42 may be formed as a 2D sheet or one or more wires. In an embodiment, a blocking width of beam stopper 42 may be determined to accord with the width of beam 35.

In some embodiments, beam stopper 42 is made from two (or more) parts placed at different height levels, as will be depicted in FIG. 7 below.

FIG. 6 is a graph 62 showing intensity distributions of X-ray photons, as a function of scattering angles of reflected X-ray beams 47 and 49 at two levels of beam-stopper opaqueness, in accordance with an embodiment of the present invention. A curve 64 is acquired while using a conventional, opaque beam-stopper. A curve 66 is acquired while using partially-opaque beam-stopper 42. The difference between the levels of attenuation at the center of beam 35 can be seen clearly in the figure.

FIG. 7 is a schematic, sectional view of two settings 70 and 78 of a beam stopper having an adjustable effective width, in accordance with an embodiment of the present invention. Each of settings 70 and 78 may be implemented, for example, in beam stopper 42 of FIG. 1 above.

In the example of FIG. 1, beam 35 is scattered from wafer 22 at an angular range. In some embodiments, setting 70 (as well as setting 78) comprises two beam stopping elements 72 and 74, each such element may be formed as a wire or a sheet, or in any other suitable form. In an embodiment, elements 72 and 74 are movable relative to one another and each of them may be partially or fully opaque with respect to beam 35.

In an embodiment, an effective width 76 set for beam stopper 42 determines a corresponding partial sector (or the entire range) of the angular range of beam 35 in which beam stopper 42 partially or fully blocks the intensity of beam 35.

In the examples of settings 70 and 78 of beam stopper 42, element 72 is positioned above element 74. In the example of setting 70, elements 72 and 74 are moved horizontally relative to one another, to be positioned overlapping one another, so as to set the desired effective width of beam stopper 42.

In the example of setting 78, the horizontal overlap between elements 72 and 74 is minimal (e.g., almost zero), and therefore an effective width 80 of beam stopper 42, is larger than effective width 76.

In some embodiments, using setting 70 or 78 in beam stopper 42 enables partially or fully blocking the intensity of beam 35 within a configurable partial sector of the angular range of beam 35.

In some embodiments, the position of elements 72 and 74 relative to one another, and therefore also the amount of overlapping between them, is controlled so as to accommodate blocking (or partially blocking) the intensity of transmitted beam 35, having different divergence or size, thereby optimizing the conditions of the SAXS-based measurements.

In an embodiment, the effective width of beam stopper 42 determines a tradeoff between the intensity and the angular resolution as shown in graphs 56 and 62 above. The effective width of beam stopper 42 may be adjusted in accordance with the repetitive features being measured.

For example, a given effective width may be used when a high intensity but small angular resolution are required while measuring arrays having small repetitive features, such as holes 50. Alternatively, a different effective width may be used when a low intensity but large angular resolution are required while measuring arrays having larger repetitive features whose scattering peaks are closer to one another.

In other embodiments, instead of using the two beam stopping elements, the mechanism for adjusting the effective width of beam stopper 42 may be implemented using any other suitable technique.

In an embodiment, beam stopper 42 may comprise a rotatable rectangular beam stopping element (not shown), which may be positioned with its short side facing beam 35. In an embodiment, processor 34 (or a controller of the beam stopping element) is configured to rotate the rectangular element about its axis (e.g., center of gravity) at any desired angle between 0-90 degrees, so as to adjust the effective width of the beam stopper. For example, at zero (0) degrees, beam 35 impinges only on the short side of the element, so that the effective width is minimal and equals the dimension of the short side. The effective width changes with the rotation angle according to the respective projection of beam 35 on the long and short sides of the element.

In another embodiment, beam stopper 42 may comprise multiple beam stopping elements mounted along an axis of a motorized translation stage. Each beam stopping element can be made, for example, from a sheet having a different width. In an embodiment, processor 34 (or a controller of the translation stage) is configured to set the effective width of beam stopper 42 by moving the translation stage so that the desired beam stopping element is placed in beam 35.

Further alternatively, beam stopper 42 may have any other suitable shape, configuration and/or adjustment mechanism, which provide an adjustable effective width.

Although the embodiments described herein mainly address HAR features in semiconductor devices, the methods and systems described herein can also be used in other applications, such as in measuring geometrical dimensions of any repetitive 2D or 3D feature formed in any device, such as devices comprising magnetic nanostructures.

It will be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A system, comprising:
an X-ray source, which is configured to direct an X-ray beam on a sample;
a detector assembly, which is configured to detect one or more X-ray beams transmitted through and scattered from the sample, and to produce respective electrical signals in response to the detected X-ray beams; and
an X-ray beam stopper, which is only partially-opaque to X-rays, which is located between the sample and the detector assembly, and which is configured to partially-block and partially-transmit an intensity of one or more of the X-ray beams impinging thereon.

2. A system, comprising:
an X-ray source, which is configured to direct an X-ray beam on a sample;
a detector assembly, which is configured to detect one or more X-ray beams transmitted through and scattered from the sample over an angular range, and to produce respective electrical signals in response to the detected X-ray beams; and
an X-ray beam stopper, which is located between the sample and the detector assembly and comprises at least first and second beam-stopping elements, which are positioned simultaneously in the X-ray beam and are movable relative to one another so as to set a configurable effective width of the X-ray beam stopper by controlling an amount of overlap between the first and second beam-stopping elements, and which is configured to at least partially block an intensity of the X-ray beams within a configurable partial sector of the angular range, depending on the configurable effective width.

3. The system according to claim 2, wherein the X-ray beam stopper comprises a rotatable beam stopping element, which is configured to rotate about an axis so as to set the effective width.

4. The system according to claim 2, and comprising a processor, which is configured to adjust the effective width of the X-ray beam stopper responsively to a divergence angle of the X-ray beam.

5. The system according to claim 2, and comprising a processor, which is configured is configured to adjust the effective width of the X-ray beam stopper responsively to a size of repetitive features on the sample.

\* \* \* \* \*